United States Patent [19]
Lee et al.

[11] Patent Number: 5,704,984
[45] Date of Patent: Jan. 6, 1998

[54] CHEMICAL VAPOR DEPOSITION APPARATUS WITH A HEAT RADIATION STRUCTURE

[75] Inventors: Nam-Jin Lee; Sang-Kook Choi; Hyeog-Joon Ko, all of Suwon; Chung-Hwan Kwon, Kyungki-do, all of Rep. of Korea

[73] Assignee: Samsung Electronics Co., Ltd., Suwon, Rep. of Korea

[21] Appl. No.: 768,703

[22] Filed: Dec. 18, 1996

[30] Foreign Application Priority Data

Dec. 18, 1995 [KR] Rep. of Korea ............... 95-51495

[51] Int. Cl.$^6$ .................................................. C23C 16/00
[52] U.S. Cl. ................................................ 118/724; 118/725
[58] Field of Search ........................................ 118/724, 725

[56] References Cited

U.S. PATENT DOCUMENTS 5,029,554  7/1991  Miyashita .................. 118/725
5,346,555  9/1994  Nunotani .................. 118/724
5,370,371  12/1994  Miyagi .................... 118/724

*Primary Examiner*—Richard Bueker
*Attorney, Agent, or Firm*—Jones & Volentine, L.L.P.

[57] ABSTRACT

A chemical vapor deposition (CVD) apparatus having a heat radiation structure. The CVD apparatus has a process chamber wherein the semiconductor substrate is located, a gas inlet for introducing a process gas into the process chamber, a manifold for supporting the process chamber and the gas inlet, and a heat radiating member provided around the gas inlet, for radiating heat transmitted from the manifold. The gas inlet has a plurality of radiation plates formed around the gas inlet and a plurality of through-holes formed in each of the radiation plates. With the gas inlet having the heat radiating structure, heat from the manifold during the deposition process is not transmitted to the gas supply line and the like. Thus the associated parts are not corroded or deformed.

7 Claims, 3 Drawing Sheets

CHEMICAL VAPOR DEPOSITION APPARATUS WITH A HEAT RADIATION STRUCTURE

BACKGROUND OF THE INVENTION

1. Field of Invention

The present invention relates to a chemical vapor deposition apparatus for depositing a thin film on a semiconductor substrate, and more particularly, this invention relates to a chemical vapor deposition (CVD) apparatus having a gas inlet with heat radiating plates to present heat from being transmitted from the gas inlet to a gas supply line.

2. Description of the Related Art

FIG. 1A is a cross-sectional representation of a vertical furnace of a conventional chemical vapor deposition machine which is used to deposit a thin film on a semiconductor substrate. The CVD machine has a vertical furnace which consists of an outer tube 110 and an inner tube 111 disposed within the outer tube 110. The vertical furnace is fixed by a manifold 130 which is made of a metal and provided to isolate the tubes 110 and 111 from the atmosphere. On both sides of the vertical furnace, a heater 120 is provided to keep the internal temperature of the furnace constant.

FIG. 1B is an enlarged view of portion "A" of the manifold shown in FIG. 1A. As shown in FIG. 1B, a gas supply line 160 and a gas injector 150 are connected to each other through a gas inlet 140, which is fixed to the manifold 130, so as to introduce a process gas into the vertical furnace serving as a process chamber. The process gas is supplied through the gas supply line 160. Corrosion of the gas inlet 140 exerts a negative influence on the deposition process. The gas injector 150 and the gas supply line 160 communicate with respective ends of the gas inlet 140. Reference numerals 161 and 170 are a nozzle and an O-ring, respectively.

In the conventional CVD apparatus with the above described construction, the furnace is heated by the heater 120 and is maintained at a high temperature during the deposition process. The manifold 130 is heated to a high temperature by the heated furnace. The high temperature of the manifold 130 is transmitted to the gas inlet 140 and the gas supply line 160, which are coupled to the manifold 130, causing corrosion of the manifold and associated parts, and deformation of the O-ring 170. It becomes difficult to dissolve the corrosion and reassemble the corroded parts. In addition, the degradation of the O-ring 170 lowers its sealing performance.

Also, the corrosion of the associated parts causes particles, which may, together with the gas, flow into the furnace. Such particles contaminate the inside of the furnace, whereby defects are generated on a semiconductor substrate during the deposition process.

To solve such problems, heat radiating techniques have been proposed. One technique is to extend the length of the gas inlet. With this technique, however, the equipment size is increased and the radiation effect is insufficient.

SUMMARY OF THE INVENTION

It is therefore an object of the present invention to provide a chemical vapor deposition apparatus having a gas inlet with heat radiating plates to prevent the transmission of heat from the gas inlet to a gas supply line.

It is another object of the present invention to provide a chemical vapor deposition apparatus with a heat radiation structure which can prevent the gas inlet from being deformed and/or corroded due to the large amount of heat generated during the deposition process.

It is a further object of the present invention to provide a chemical vapor deposition apparatus with a heat radiation structure which is smaller in size but which has superior radiation effects.

According to an aspect of the present invention, a chemical vapor deposition apparatus for depositing a thin film on a semiconductor substrate, comprises a process chamber wherein the semiconductor substrate is located; a gas inlet for introducing a process gas into the process chamber; a manifold for supporting the process chamber and the gas inlet; and heat radiating means provided around the gas inlet for radiating heat transmitted from the manifold. The process chamber comprises a vertical furnace having a first outer tube and a second tube formed inside the first tube. The heat radiating means comprises a plurality of radiation plates formed around the gas inlet. With the heat radiating means, the heat transmitted from the manifold during the deposition process can radiate through the radiation plates.

Thus, the CVD apparatus according to this invention can prevent the gas inlet from being deformed and/or corroded due to the high heat which is transmitted from the manifold.

BRIEF DESCRIPTION OF THE ATTACHED DRAWINGS

This invention may be understood and its objects will become apparent to those skilled in the art by reference to the accompanying drawing in which.

DETAILED DESCRIPTION OF THE PREFERRED EMBODIMENTS

Figure 1A:
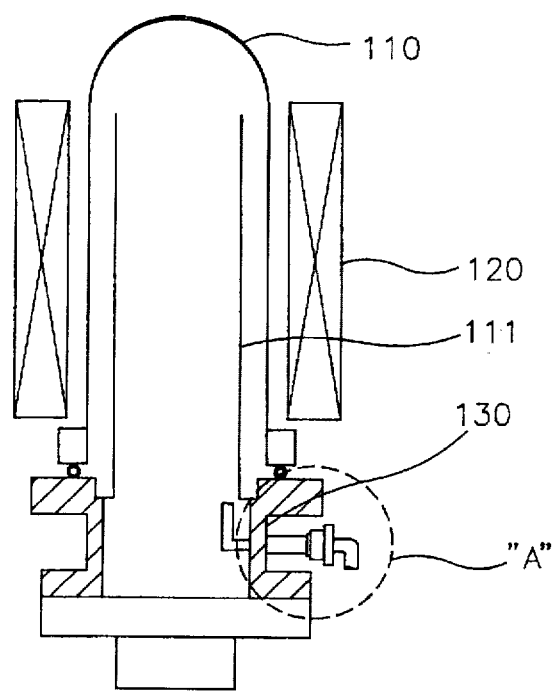
FIG. 1A is a cross-sectional view of a conventional CVD apparatus.
Figure 1B:
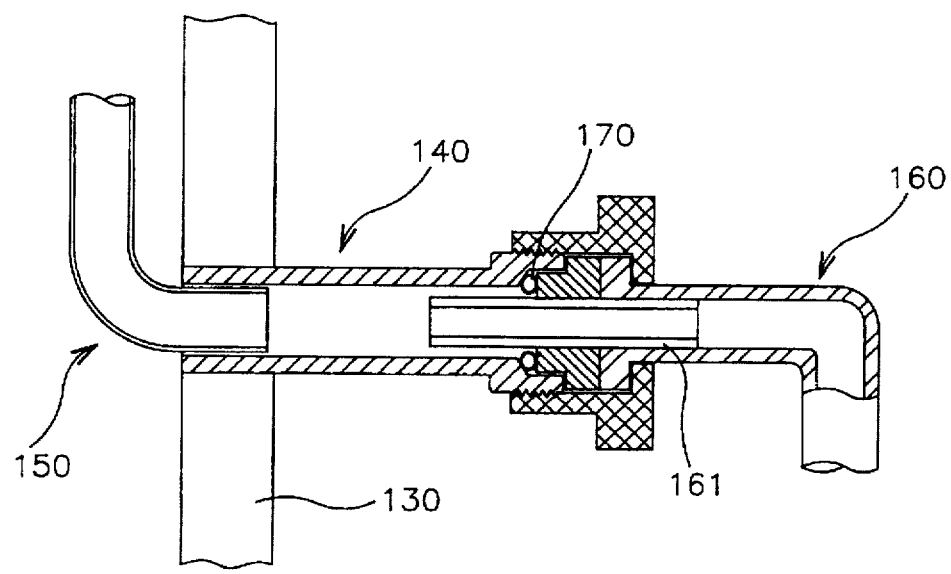
FIG. 1B is an enlarged view of the manifold portion "A" shown in FIG. 1A.
Figure 2A:
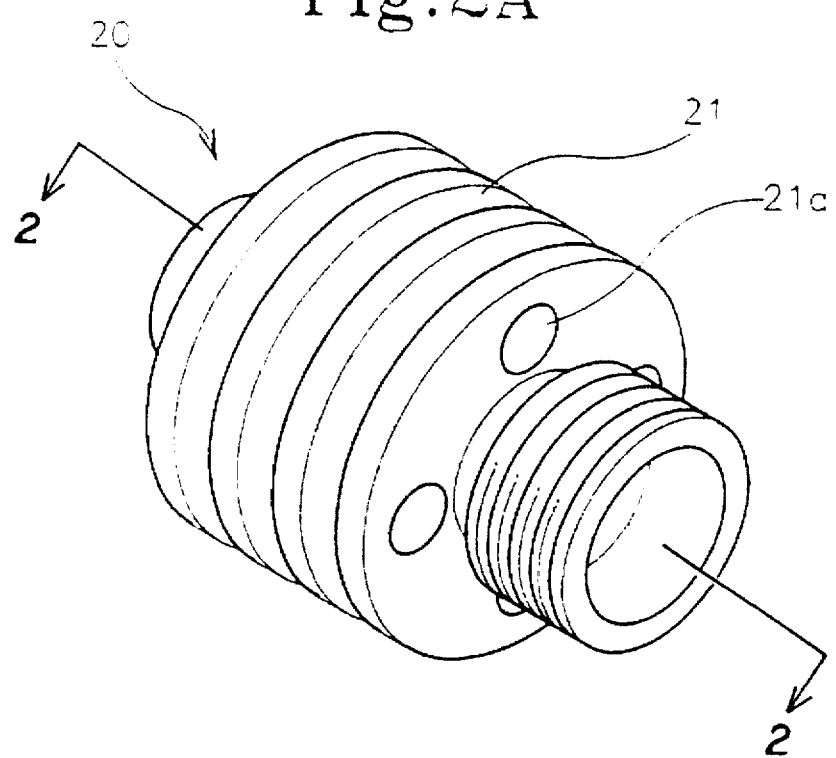
FIG. 2A is a perspective view of a gas inlet of a novel CVD apparatus according to the present invention.
Figure 2B:
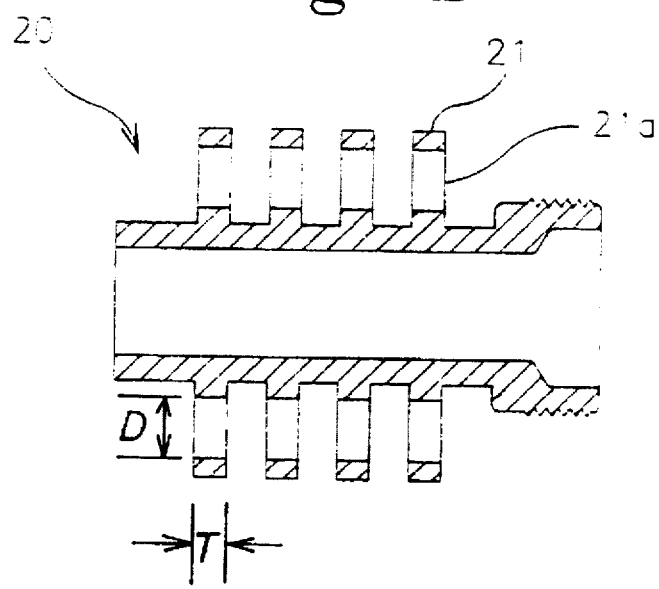
FIG. 2B is a longitudinal cross-sectional view of the gas inlet shown in FIG. 2A taken along the line 2—2 and FIG. 3 is a cross-sectional view showing the connection of the gas inlet with a manifold of the CVD apparatus.
Figure 3:
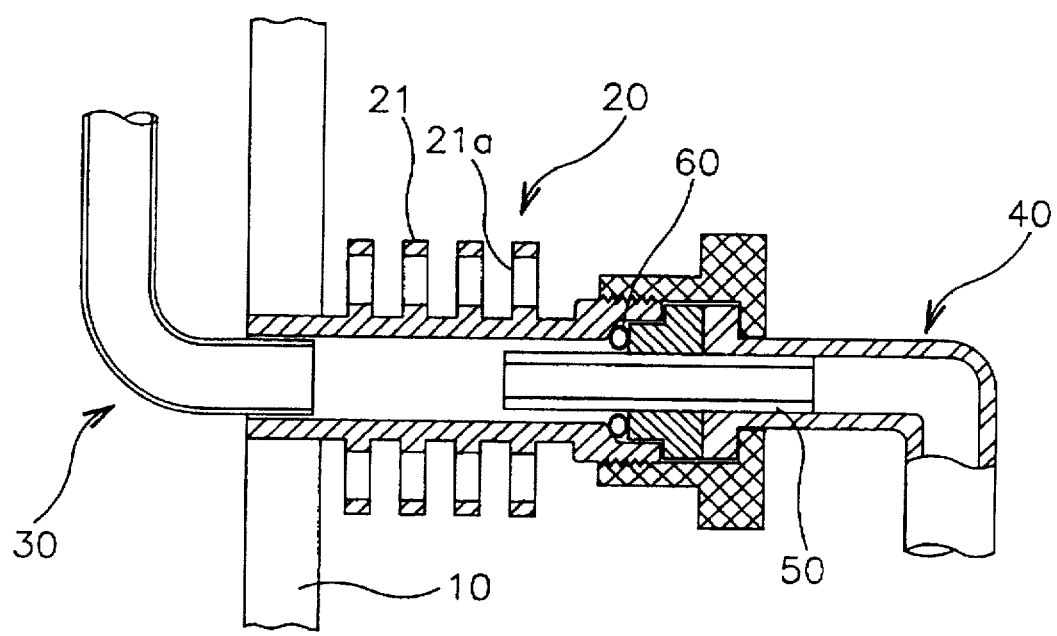

Referring to FIGS. 2A, 2B and 3, a novel CVD apparatus in accordance with the present invention comprises a gas inlet 20 for introducing a process gas through a gas injector 30 into a process chamber which serves as a vertical furnace. A manifold 10 supports the process chamber and the gas inlet 20. Heat radiating means are provided around the gas inlet 20, for radiating heat transmitted from the manifold 10. The process chamber has a first outer tube and a second tube formed inside the first tube, similar to that of FIG. 1A.

Referring specifically to FIGS. 2A and 2B, the gas inlet 20 has heat radiating means, which is composed of a plurality of radiation plates 21, around the gas inlet 20. The plates 21 may be substantially formed around the gas inlet 20 in a single body. Each of the plates 21 has a plurality of through-holes 21a formed therein, such that the heat radiation effect can be improved. The diameter "D" of each of the through-holes 21a is larger that the thickness "T" of each of the radiation plates 21.

FIG. 3 shows a portion of the CVD apparatus with which the gas inlet 20 of this embodiment is implemented. In FIG. 3, a gas injector 30 inside the process chamber is combined with one end of the gas inlet 20, which is connected to the gas injector through the manifold 10. A nozzle 50 and a gas supply line 40 are connected to the other end of the gas inlet 20. Numeral 60 is an O-ring for maintaining a solid sealing state between the gas inlet 20 and the nozzle 50.

As described above, a CVD apparatus according to the present invention has a gas inlet which radiates the heat transmitted from a manifold during the deposition process, so that corrosion and deformation of the manifold and its associated parts are prevented.

Additionally, since the through-holes 21a on each radiation plate 21 of the gas inlet 20 play an important role in improving the heat radiation effect, the CVD apparatus itself has an improved radiation effect.

Although preferred embodiments of the present invention have been described in detail hereinabove, it should be clearly understood that many variations and/or modifications of the basic inventive concepts herein taught, which may appear to those skilled in the art, will still fall within the spirit and scope of the present invention as defined in the appended claims and their equivalents.

What is claimed is:

1. A chemical vapor deposition apparatus for depositing a thin film on a semiconductor substrate, comprising:

a process chamber wherein the semiconductor substrate is located;

a gas inlet for introducing a process gas into the process chamber;

a manifold for supporting the process chamber and the gas inlet; and heat radiating means provided around the gas inlet for radiating heat transmitted from the manifold.

2. The chemical vapor deposition apparatus of claim 1, wherein said process chamber comprises a vertical furnace having a first outer tube and a second tube formed inside the first outer tube.

3. The chemical vapor deposition apparatus of claim 1, wherein said heat radiation means is integrally provided with said gas inlet.

4. The chemical vapor deposition apparatus of claim 1, wherein said heat radiating means comprises a plurality of radiation plates formed around the gas inlet.

5. The chemical vapor deposition apparatus of claim 3, wherein said heat radiating means comprises a plurality of radiation plates formed around the gas inlet.

6. The chemical vapor deposition apparatus of claim 4, further comprising a plurality of through-holes formed in each of the radiation plates.

7. The chemical vapor deposition apparatus of claim 4, wherein a diameter of each of the through-holes is larger than a thickness of each of the radiation plates.

* * * * *